(12) United States Patent
Jia et al.

(10) Patent No.: US 9,116,398 B2
(45) Date of Patent: Aug. 25, 2015

(54) ARRAY SUBSTRATE AND AN LCD DEVICE

(75) Inventors: Pei Jia, Shenzhen (CN); Liuyang Yang, Shenzhen (CN)

(73) Assignee: SHENZHEN CHINA STAR OPTOELECTRONICS TECHNOLOGY CO LTD, Shenzhen (CN)

( * ) Notice: Subject to any disclaimer, the term of this patent is extended or adjusted under 35 U.S.C. 154(b) by 0 days.

(21) Appl. No.: 13/522,968

(22) PCT Filed: Jun. 7, 2012

(86) PCT No.: PCT/CN2012/076551
§ 371 (c)(1),
(2), (4) Date: Jul. 19, 2012

(87) PCT Pub. No.: WO2013/181814
PCT Pub. Date: Dec. 12, 2013

(65) Prior Publication Data
US 2015/0077671 A1    Mar. 19, 2015

(30) Foreign Application Priority Data
Jun. 4, 2012   (CN) .......................... 2012 1 0180822

(51) Int. Cl.
*G02F 1/1343* (2006.01)
*G02F 1/1337* (2006.01)
*G02F 1/1335* (2006.01)
*G02F 1/1368* (2006.01)
*H01L 27/12* (2006.01)

(52) U.S. Cl.
CPC ........ *G02F 1/134309* (2013.01); *G02F 1/1336* (2013.01); *G02F 1/1368* (2013.01); *G02F 1/133514* (2013.01); *G02F 1/133707* (2013.01); *H01L 27/124* (2013.01); *G02F 2001/13373* (2013.01); *G02F 2001/134345* (2013.01); *G02F 2201/121* (2013.01)

(58) Field of Classification Search
CPC .............. G02F 2001/134372; G02F 1/134309; G02F 1/133514; G02F 1/1336; G02F 1/133707; G02F 1/1368; H01L 27/124
USPC .......................................................... 349/141
See application file for complete search history.

(56) References Cited

U.S. PATENT DOCUMENTS 7,999,899 B1 *   8/2011   Yu et al. ......................... 349/143

* cited by examiner

*Primary Examiner* — James Dudek
(74) *Attorney, Agent, or Firm* — Mark M. Friedman

(57) ABSTRACT

The present invention discloses an array substrate, which includes a thin-film transistor, a data line, a gate line, and a pixel electrode. The array substrate further includes a common electrode. The common electrode has a first region, a second region, and at least one opening. The first region is defined on the common electrode, and the first region is a projection of the pixel electrode on a plane where the common electrode is located. The second region is defined on the common electrode, and the second region is close to at least one edge of the first region. The at least one opening is disposed on the second region of the common electrode.

14 Claims, 2 Drawing Sheets

ARRAY SUBSTRATE AND AN LCD DEVICE

FIELD OF THE INVENTION

The present invention relates to a liquid crystal display (LCD) technology, and especially to an array substrate and an LCD device.

BACKGROUND OF THE INVENTION

Multiple pixel electrodes are disposed on an array substrate of a conventional LCD device. The pixel electrodes are utilized to generate an electric field for applying to liquid-crystal molecules, thereby altering orientations of the liquid-crystal molecules. Each pixel electrode herein has at least two trunk electrodes and multiple strip electrodes. The two trunk electrodes are perpendicular to each other, and the strip electrode are arranged along a certain angle with respect to the trunk electrodes. When the strip electrodes of the pixel electrode are energized, charge densities distributed over the pixel electrode are quite different between an edge and a central region. That is, the charge density at an end of the strip electrode that is away from the two trunk electrodes is larger than the charge densities at other portions of the strip electrode, such that a strength and a direction of an force, which is applied to the liquid-crystal molecules, generated from the edge of the pixel electrode are different from those generated from the central region of the pixel electrode. As a result, arrangements of the liquid-crystal molecules are in disorder around the edge of the pixel electrode, so a display effect of the LCD device is reduced.

SUMMARY OF THE INVENTION

An objective of the present invention is to provide an LCD device which can prevent the liquid-crystal molecules around the edge of the pixel electrode from forming the disorder arrangement to reduce the display effect of the LCD device.

To achieve the foregoing objective, an LCD device provided in the present invention includes a backlight source, an array substrate, and a color filter substrate. The array substrate includes a thin-film transistor, a data line, and a gate line. The array substrate herein further includes a pixel electrode and a common electrode. The pixel electrode includes at least one strip electrode and at least one trunk electrode. The common electrode has a first region, a second region, and at least one opening. The first region is defined on the common electrode, and the first region is a projection of the pixel electrode on a plane where the common electrode is located. The second region is defined on the common electrode, and the second region is close to at least one edge of the first region, in which the second region is located around four edges of the first region. The at least one opening is disposed on the second region of the common electrode. A position of each of the least one opening is close to the edges of the pixel electrode on the second region, and a depth of the opening is less than or equal to a thickness of the common electrode.

In the above-mentioned LCD device, a center of each of the least one opening and each of the at least one strip electrode are collinear on the plane where the common electrode is located.

In the above-mentioned LCD device, the at least one opening is disposed on a surface of the common electrode facing the pixel electrode.

In the above-mentioned LCD device, the at least one opening is disposed on a surface of the common electrode away from the pixel electrode.

In the above-mentioned LCD device, the first region is a projection of an external contour of the pixel electrode on the plane where the common electrode is located, and the external contour is a shape formed by ends of the at least one strip electrode away from the at least one trunk electrode being linked in a series.

Another objective of the present invention is to provide an array substrate which can prevent the liquid-crystal molecules around the edge of the pixel electrode from forming the disorder arrangement to reduce the display effect of the LCD device.

To achieve the foregoing objective, an array substrate provided in the present invention includes a thin-film transistor, a data line, a gate line, and a pixel electrode. The pixel electrode includes at least one strip electrode and at least one trunk electrode. The array substrate further includes a common electrode. The common electrode has a first region, a second region, and at least one opening. A first region defined on the common electrode, the first region being a projection of the pixel electrode on a plane where the common electrode is located; and the second region is defined on the common electrode, and the second region is close to at least one edge of the first region. The at least one opening is disposed on the second region of the common electrode.

In the above-mentioned array substrate, a position of each of the least one opening is close to edges of the pixel electrode on the second region.

In the above-mentioned array substrate, the second region is located around four edges of the first region.

In the above-mentioned array substrate, a depth of the opening is less than or equal to a thickness of the common electrode.

In the above-mentioned array substrate, a center of each of the least one opening and each of the at least one strip electrode are collinear on the plane where the common electrode is located.

Yet another objective of the present invention is to provide an LCD device which can prevent the liquid-crystal molecules around the edge of the pixel electrode from forming the disorder arrangement to reduce the display effect of the LCD device.

To achieve the foregoing objective, an LCD device provided in the present invention includes a backlight source, an array substrate, and a color filter substrate. The array substrate includes a thin-film transistor, a data line, and a gate line. The array substrate further includes a pixel electrode and a common electrode. The pixel electrode includes at least one strip electrode and at least one trunk electrode. The common electrode has a first region, a second region, and at least one opening. The first region is defined on the common electrode, and the first region is a projection of the pixel electrode on a plane where the common electrode is located. The second region is defined on the common electrode, and the second region is close to at least one edge of the first region. The at least one opening is disposed on the second region of the common electrode.

In the above-mentioned LCD device, a position of each of the least one opening is close to edges of the pixel electrode on the second region.

In the above-mentioned LCD device, the second region is located around four edges of the first region.

In the above-mentioned LCD device, a depth of the opening is less than or equal to a thickness of the common electrode.

In the above-mentioned LCD device, a center of each of the least one opening and each of the at least one strip electrode are collinear on the plane where the common electrode is located.

In comparison with the prior art, the openings are disposed beside the edges of the pixel electrode above the common electrode, and the positions of the openings are around the four edges of the pixel electrode. The openings are disposed on the surface of the common electrode facing the pixel electrode or away from the pixel electrode, and the charges are accumulated on interior walls of the openings. Therefore, an electric field is formed between the opening and the end of the strip electrode away from the trunk electrode. In addition, because the openings have the depth which is less than or equal to the thickness of the common electrode, an orientation and the depth of the openings can be configured in accordance with the strength and direction of the force applied to the liquid-crystal molecules, thereby adjusting the number of the charges accumulated on the interior walls of the openings. Accordingly, the electric field which is formed between the opening and the end of the strip electrode away from the trunk electrode can be adjusted for changing the arrangement of the liquid-crystal molecules around the edges of the pixel electrode, so that the orientation of the liquid-crystal molecules around the edges of the pixel electrode is substantially the same to the orientation of the liquid-crystal molecules at the region (the central region) out of the edges of the pixel electrode. Thus, the disorder arrangement of the liquid-crystal molecules occurring around the edge of the pixel electrode can be prevented for increasing the display effect of the LCD device.

It is to be understood that both the foregoing general description and the following detailed description of the present invention are exemplary and explanatory and are intended to provide further explanation of the invention as claimed.

DETAILED DESCRIPTION OF THE PREFERRED EMBODIMENTS

Descriptions of the following embodiments refer to attached drawings which are utilized to exemplify specific embodiments.

Figure 1:
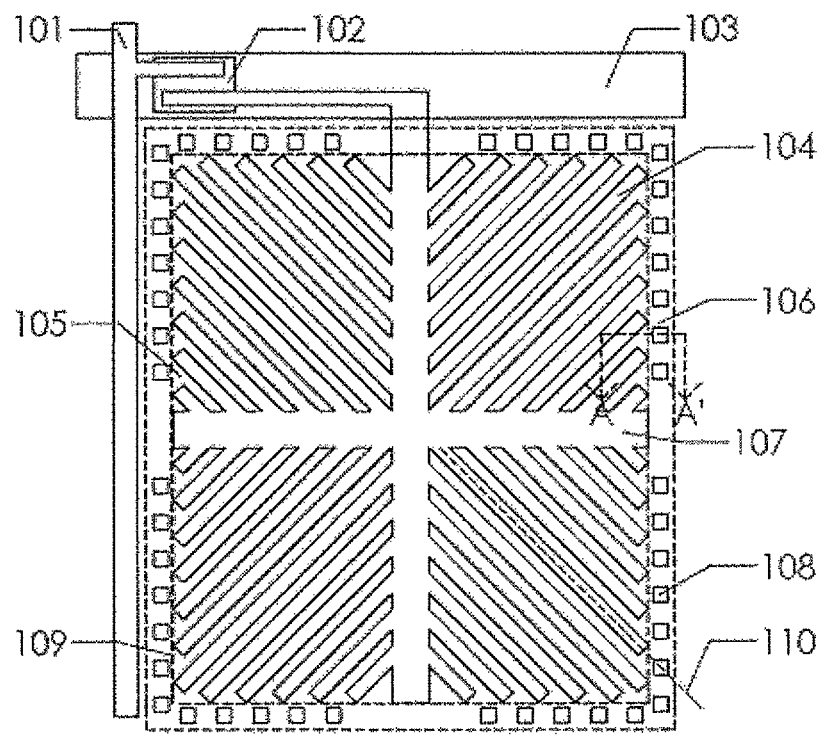
FIG. 1 is a partial schematic drawing illustrating an array panel of the present invention.
Figure 2:
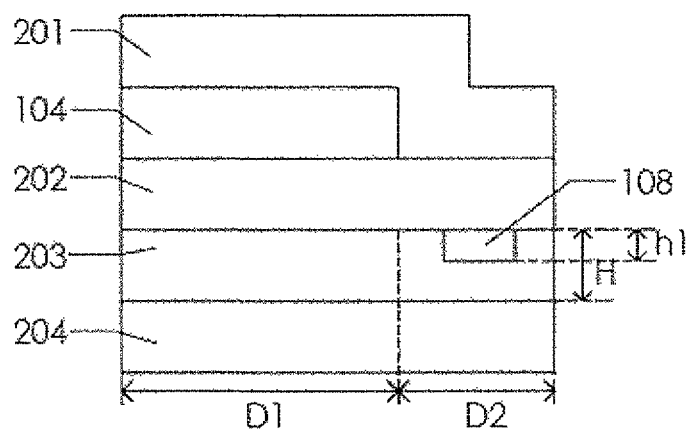
FIG. 2 is a partial schematic cross-section along A-A' in FIG. 1 according to a first embodiment.
Figure 3:
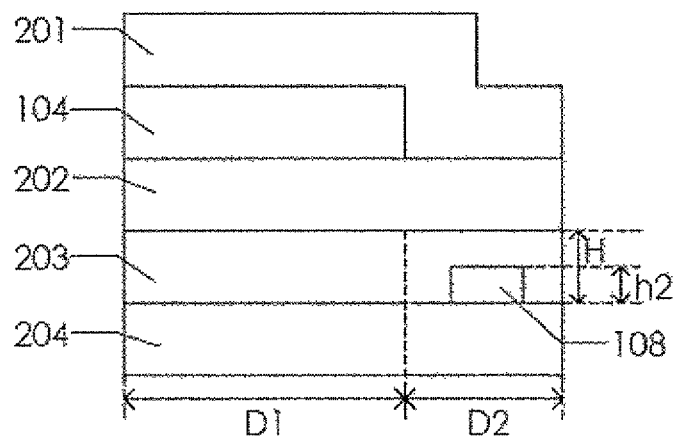
FIG. 3 is a partial schematic cross-section along A-A' in FIG. 1 according to a second embodiment.

Referring to FIG. 1, FIG. 1 is a partial schematic drawing illustrating an array panel of the present invention. The array substrate of the present invention includes a gate line 103, a data line 101, a thin-film transistor 102, a pixel electrode 109, and a common electrode 203 (as shown in FIG. 2 and FIG. 3). The pixel electrode 109 has two trunk electrodes 107 being perpendicular to each other and a plurality of strip electrodes 104, both of which are disposed thereon. One end of each strip electrode 104 is coupled to the trunk electrode 107, and an opposite end thereof is toward a direction away from the trunk electrode 107. There are two regions disposed on the common electrode 203, and the two regions are respectively designate as a first region 105 and a second region 106. The first region 105 and the second region 106 are coplanar; furthermore, both regions are on a plane where the common electrode is located without overlap. The first region 105 corresponds to the position where the pixel electrode 109 is. Specifically, the first region 105 is a projection of an external contour of the pixel electrode 109 on the plane where the common electrode 203 is located. A shape and area of the first region 105 are the same as those of the external contour. The external contour is a shape formed by ends of the plurality of strip electrodes 104 far from the trunk electrode 107 being linked in a series. The second region 106 abuts upon the first region 105. Specifically, the second region 106 is close to at least one edge of the first region 105. The second region 106 can symmetrically disposed beside both sides of the first region 105. Besides, the second region 106 also can surround the first region 105 at three edges thereof. Besides, the second region 106 also can surround the first region 105 at four edges thereof. There are a plurality of openings 108 disposed on the second region 106. Shapes of the openings 108 are rectangular, circular, triangular, arbitrary, and so on. Positions of the openings 108 face the ends of the strip electrodes 104 away from the trunk electrode 107. That is, a center of each opening 108 and each strip electrode 104 are collinear (dashed line 110) on the plane where the common electrode 203 is located.

Referring to FIG. 2, FIG. 2 is a partial schematic cross-section along A-A' in FIG. 1 according to a first embodiment. In the embodiment, a glass substrate 204, a common electrode 203, an insulative layer 202, the pixel electrode 109 (the strip electrode 104), and a passivating layer 201 are laminated into one body in sequence. The opening 108 is disposed on the second region 106 of the common electrode 203. The position of the opening 108 is close to the edges of the pixel electrode 109 (the strip electrode 104) on the second region 106. Specifically, the opening 108 is disposed at positions which face the ends of the strip electrodes 104 away from the trunk electrode 107. That is, the center of each opening 108 and each strip electrode 104 are collinear (line 110) on the plane where the common electrode is located. The opening 108 is disposed on a surface of the common electrode 203 facing the pixel electrode 109 (the strip electrode 104) and has a first predetermined depth h1. The first predetermined depth h1 is less than or equal to a thickness H of the common electrode 203.

Referring to FIG. 3, FIG. 3 is a partial schematic cross-section along A-A' in FIG. 1 according to a second embodiment. In the embodiment, a glass substrate 204, a common electrode 203, an insulative layer 202, the pixel electrode 109 (the strip electrode 104), and a passivating layer 201 are laminated into a unity in sequence. The opening 108 is disposed on the second region 106 of the common electrode 203. The position of the opening 108 is close to the edges of the pixel electrode 109 (the strip electrode 104) on the second region 106. Specifically, the opening 108 is disposed at positions which face the ends of the strip electrodes 104 away from the trunk electrode 107. That is, the center of each opening 108 and each strip electrode 104 are collinear (dashed line 110) on the plane where the common electrode is located. The opening 108 is disposed on a surface of the common electrode 203 away from the pixel electrode 109 (the strip electrode 104) and has a second predetermined depth h2. The second predetermined depth h2 is less than or equal to the thickness H of the common electrode 203.

The LCD device of the present invention includes a backlight source, the array substrate, and a color filter substrate. The backlight source, the array substrate, and the color filter substrate are laminated into one body in sequence. As shown in FIGS. 1-3, the array substrate includes the gate line 103, the data line 101, the thin-film transistor 102, the pixel electrode 109, and the common electrode 203. The pixel electrode 109 has the two trunk electrodes 107 being perpendicular to each other and the plurality of strip electrodes 104, both of which are disposed thereon. The end of each strip electrode 104 is coupled to the trunk electrode 107, and the opposite end thereof is toward the direction away from the trunk electrode 107. There are two regions disposed on the common electrode, and the two regions are respectively designate as the first region 105 and the second region 106. The first region 105 and the second region 106 are coplanar; furthermore, both regions are on a plane where the common electrode 203 is located without overlap. The first region 105 corresponds to the position where the pixel electrode 109 is. Specifically, the first region 105 is the projection of the external contour of the pixel electrode 109 on the plane where the common electrode 203 is located. The shape and area of the first region 105 are the same as those of the external contour. The external contour is the shape formed by the ends of the plurality of strip electrodes 104 away from the trunk electrode 107 being linked in a series. The second region 106 abuts upon the first region 105. Specifically, the second region 106 is close to at least one edge of the first region 105. The second region 106 can symmetrically disposed beside both sides of the first region 105. Besides, the second region 106 also can surround the first region 105 at three edges thereof. Besides, the second region 106 also can surround the first region 105 at four edges thereof. There are the plurality of openings 108 disposed on the second region 106. The shapes of the openings 108 are rectangular, circular, triangular, arbitrary, and so on. The positions of the openings 108 face the ends of the strip electrodes 104 away from the trunk electrode 107. That is, the center of each opening 108 and each strip electrode 104 are collinear (dashed line 110) on the plane where the common electrode 203 is located. Observing the cross-section (as shown in FIG. 2 and FIG. 3) along A-A' shown in FIG. 1, The array substrate includes the glass substrate 204, the common electrode 203, the insulative layer 202, the pixel electrode 109 (the strip electrode 104), and the passivating layer 201. The glass substrate 204, the common electrode 203, the insulative layer 202, the pixel electrode 109 (the strip electrode 104), and the passivating layer 201 are laminated into one body in sequence. The opening 108 is disposed on the second region 106 of the common electrode 203. The position of the opening 108 is close to the edges of the pixel electrode 109 (the strip electrode 104) on the second region 106. Specifically, the opening 108 is disposed at positions which face the ends of the strip electrodes 104 away from the trunk electrode 107. That is, the center of each opening 108 and each strip electrode 104 are collinear (dashed line 110) on the plane where the common electrode 203 is located. The opening 108 is disposed on a surface of the common electrode 203 facing the pixel electrode 109 (the strip electrode 104) and has a first predetermined depth h1 less than or equal to a thickness H of the common electrode 203, and/or the opening 108 is disposed on a surface of the common electrode 203 away from the pixel electrode 109 (the strip electrode 104) and has a second predetermined depth h2 less than or equal to the thickness H of the common electrode 203.

In the present invention, the openings are disposed beside the edges of the pixel electrode 109 above the common electrode, and the positions of the openings are around the four edges of the pixel electrode 109. The openings are disposed on the surface of the common electrode facing the pixel electrode 109 or away from the pixel electrode 109, and the charges are accumulated on interior walls of the openings. Therefore, an electric field is formed between the opening and the end of the strip electrode away from the trunk electrode. In addition, because the openings have the depth which is less than or equal to the thickness of the common electrode, an orientation and the depth of the openings can be configured in accordance with the strength and direction of the force applied to the liquid-crystal molecules, thereby adjusting the number of the charges accumulated on the interior walls of the openings. Accordingly, the electric field which is formed between the opening and the end of the strip electrode away from the trunk electrode can be adjusted for changing the arrangement of the liquid-crystal molecules around the edges of the pixel electrode 109, so that the orientation of the liquid-crystal molecules around the edges of the pixel electrode 109 is substantially the same to the orientation of the liquid-crystal molecules at the region (the central region) out of the edges of the pixel electrode 109. Thus, the disorder arrangement of the liquid-crystal molecules occurring around the edge of the pixel electrode can be prevented for increasing the display effect of the LCD device.

While the preferred embodiments of the present invention have been illustrated and described in detail, various modifications and alterations can be made by persons skilled in this art. The embodiment of the present invention is therefore described in an illustrative but not restrictive sense. It is intended that the present invention should not be limited to the particular forms as illustrated, and that all modifications and alterations which maintain the spirit and realm of the present invention are within the scope as defined in the appended claims.

What is claimed is:

1. A liquid crystal display (LCD) device, comprising a backlight source, an array substrate, and a color filter substrate; the array substrate comprising a thin-film transistor, a data line, and a gate line; wherein the array substrate further comprises:
   a pixel electrode, the pixel electrode comprising at least one strip electrode and at least one trunk electrode, wherein one end of each strip electrode is coupled to one of the trunk electrode and an opposite end thereof is toward a direction away from the coupled trunk electrode; and
   a common electrode, the common electrode having:
      a first region defined on the common electrode, the first region being a projection of the pixel electrode on a plane where the common electrode is located;
      a second region defined on the common electrode, the second region close to at least one edge of the first region, wherein the second region is located around four edges of the first region; and
      at least one opening disposed on the second region of the common electrode, wherein a position of each of the least one opening is close to the edges of the pixel electrode on the second region, and a depth of the opening is less than or equal to a thickness of the common electrode.

2. The LCD device according to claim 1, wherein a center of each of the least one opening and each of the at least one strip electrode are collinear on the plane where the common electrode is located.

3. The LCD device according to claim 1, wherein the at least one opening is disposed on a surface of the common electrode facing the pixel electrode.

4. The LCD device according to claim 1, wherein the at least one opening is disposed on a surface of the common electrode away from the pixel electrode.

5. The LCD device according to claim wherein the first region is a projection of an external contour of the pixel electrode on the plane where the common electrode is located, and the external contour is a shape formed by ends of the at least one strip electrode away from the at least one trunk electrode being linked in a series.

6. An array substrate, comprising a thin-film transistor, a data line, a gate line, and a pixel electrode, the pixel electrode comprising at least one strip electrode and at least one trunk electrode, wherein the array substrate further comprises:
   a common electrode, the common electrode having:
      a first region defined on the common electrode, the first region being a projection of the pixel electrode on a plane where the common electrode is located; and
      a second region defined on the common electrode, the second region being close to at least one edge of the first region;
   at least one opening disposed on the second region of the common electrode, wherein a depth of the opening is less than or equal to a thickness of the common electrode.

7. The array substrate according to claim 6, wherein a position of each of the least one opening is close to edges of the pixel electrode on the second region.

8. The array substrate according 6, wherein the second region is located around four edges of the first region.

9. The array substrate according to claim 6, wherein a center of each of the least one opening and each of the at least one strip electrode are collinear on the plane where the common electrode is located.

10. A liquid crystal display (LCD) device, comprising a backlight source, an array substrate, and a color filter substrate; the array substrate comprising a thin-film transistor, a data line, and a gate line; wherein the array substrate further comprises:
   a pixel electrode, the pixel electrode comprising at least one strip electrode and at least one trunk electrode, wherein one end of each strip electrode is coupled to one of the trunk electrode and an opposite end thereof is toward a direction away from the coupled trunk electrode; and
   a common electrode, the common electrode having:
      a first region defined on the common electrode, the first region being, a projection of the pixel electrode on a plane where the common electrode is located;
      a second region defined on the common electrode, the second region close to least one edge of the first region; and
      at least one opening disposed on the second region of the common electrode, wherein a depth and an orientation of the opening are configured in accordance with a strength and a direction of a force applied to liquid crystal molecules of the LCD device.

11. The LCD device according to claim 10, wherein a position of each of the least one opening is close to edges of the pixel electrode on the second region.

12. The LCD device according to claim 10, wherein the second region is located around four edges of the first region.

13. The array substrate according to claim 10, wherein a depth of the opening is less than or equal to a thickness of the common electrode.

14. The LCD device according to claim 10, wherein a center of each of the least one opening and each of the at least one strip electrode are collinear on the plane where the common electrode is located.

* * * * *